(12) United States Patent
Bruce et al.

(10) Patent No.: US 6,303,416 B1
(45) Date of Patent: Oct. 16, 2001

(54) METHOD TO REDUCE PLASMA ETCH FLUTING

(75) Inventors: James A. Bruce, Williston; Mary C. Bushey, South Burlington; Premlatha J. Jagannathan; Walter E. Mlyriko, both of Essex Junction; Dianne L. Sundling, Huntington, all of VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/414,457

(22) Filed: Oct. 7, 1999

(51) Int. Cl.$^7$ .................................................. H01L 21/84
(52) U.S. Cl. ................................................ 438/166; 438/942
(58) Field of Search ...................................... 438/942, 944, 438/945, 950, 717, 737, 739; 430/311, 312, 313, 314, 315, 316, 317, 318, 319; 264/1.38; 216/22

(56) References Cited

U.S. PATENT DOCUMENTS

| | | |
|---|---|---|
| 4,104,070 | 8/1978 | Moritz et al. . |
| 5,486,449 | 1/1996 | Hosono et al. . |
| 5,651,857 | 7/1997 | Cronin et al. . |
| 5,654,128 * | 8/1997 | Hsu ...................................... 430/324 |
| 5,658,469 * | 8/1997 | Jennison ................................. 216/22 |
| 5,707,784 | 1/1998 | Oikawa et al. . |
| 5,747,198 * | 5/1998 | Kamijima ............................ 430/11 |
| 5,876,901 * | 3/1999 | Ishimaru .............................. 430/296 |
| 5,952,037 * | 9/1999 | Nagayama et al. .................. 427/66 |
| 5,955,244 * | 9/1999 | Duval .................................. 430/314 |
| 5,976,766 * | 11/1999 | Kasuga et al. ....................... 430/313 |
| 6,083,429 * | 7/2000 | Wester ................................ 264/1.38 |

\* cited by examiner

*Primary Examiner*—David Nelms
*Assistant Examiner*—David Vu
(74) *Attorney, Agent, or Firm*—DeLio & Peterson, LLC; John J. Tomaszewski; William D. Sabo

(57) ABSTRACT

The present invention is directed to a method and process to reduce plasma etch fluting during etching of a pattern on a semiconductor substrate by modifying the resist profile. The present invention forms a resist structure profile having an overhang or undercut, which is not in contact with the surface of the substrate. The overhang results in a shadowed region on the substrate from the primary etch direction adjacent to the base of the resist structure.

Since the overhang is not in direct contact with the substrate surface, the resist pattern does not transfer into the surface of the substrate during etching and fluting is reduced or eliminated.

6 Claims, 2 Drawing Sheets

METHOD TO REDUCE PLASMA ETCH FLUTING

BACKGROUND OF THE INVENTION

1. Field of the Invention

The present invention relates generally to the etching of patterns on a semiconductor substrate and more specifically to a method and process to reduce plasma etch fluting during the etching of a pattern on a semiconductor substrate.

2. Description of Related Art

Modern oxide plasma etches based on fluorocarbon feed gases have a tendency to create fluted or scalloped profiles. Fluting is the creation of vertical sidewall irregularities during plasma etching, also referred to as striations, scalloping or sidewall roughness. The problem with the present art is that during etching, the pattern of the modified resist structure that is adjacent to the substrate is directly transferred into the surface of the substrate. The origin of the fluting appears to be a change in the structure of the resist mask during the etch by a combination of either polymer deposition or selective erosion. Fluting creates a number of problems including rough sidewalls, metallized ceramic to metallized ceramic shorts associated with rough tungsten fill and other defects. Fluting dimensions on the order of 20 to 50 nm are particularly problematic as substrate feature dimensions approach the sub 0.2 $\mu$m regime.

Fluting is observed in many etches and different resist systems, especially when the etch contains feed gases that tend to form polymer precursors such as $CF_4$, $CHF_3$, or $C_4F_8$.

In metallized ceramic ("MC") and contact hole processes, it has been found that a carbon rich chemistry (fluorocarbon) is needed for high selectivity of the oxide etch. Polymerizing etch chemistries, such as fluorocarbon etching, produce the worst fluting while non-polymerizing gases like $O_2$, $SF_6$, and $NF_3$, produce the least amount of fluting.

Fluting is also observed with both positive and negative resists. Exposure dose does not appear to affect the extent of fluting, while focus is shown to have an effect.

The thickness of the resist, relative to the thickness of the substrate, has an impact on fluting. The more resist remaining post-etch typically correlates to less fluting. Anti-reflective coatings ("ARC") and mainly ARC open etch and etch chemistries also have an effect on fluting.

Attempts to reduce fluting have included increasing the resist thickness, although, in metallized ceramic, a resist thickness of 7000 to 9000 angstroms did not have an effect for the typical 6500 angstrom etched MC depth. A drawback to increasing the resist thickness is that it will restrict resolution capability as one moves to smaller dimensions on the substrate and will also increase the aspect ratio of resist height to width to greater than 3:1.

Another method to reduce fluting is to optimize etch chemistries, such as by adding $O_2$. This method reduces fluting but also reduces oxide etch selectivity. The use of $SF_6$ and $NF_3$, gases, which are non-polymerizing, can reduce fluting, but they also reduce etch selectivity.

The use of ultraviolet ("UV") light in post development treatment can be used to harden the resist and helps decrease resist erosion by densification of the resist film. This method works better for I-line resists. Chemically amplified films (e.g., DUV resists) tend to shrink upon UV hardening. However, UV hardening, while decreasing resist erosion, has not been shown to reduce fluting.

Other methods of reducing sidewall roughness during dry etching include the choice of dielectric etch chemistry, modification of the initial resist processing and deposition of an SiN sidewall, flood exposure of the initial photoresist mask and optimization of the postbake temperature. Some of the drawbacks of these processes include: added process costs, a reduced process window, are usable only for certain processes or are only marginally effective.

Bearing in mind the problems and deficiencies of the prior art, it is therefore an object of the present invention to provide a method and process to reduce fluting during the etching of a resist pattern on a semiconductor substrate.

It is another object of the present invention to provide a method and process to reduce fluting during the etching of a pattern on a semiconductor substrate that does not restrict resolution capability.

A further object of the invention is to provide a method and process to reduce fluting during the etching of a pattern o n a semiconductor substrate that does not limit oxide etch selectivity.

Still other objects and advantages of the invention will in part be obvious and will in part be apparent from the specification.

SUMMARY OF THE INVENTION

The above and other objects and advantages, which will b e apparent to one of skill in the art, are achieved in the present invention which is directed to, in a first aspect, a method of forming a resist pattern t o reduce fluting on a substrate during an etching process. The method comprises the steps of applying a layer of a resist material, the resist layer having an upper portion and a lower portion, on a surface of the substrate. The resist layer and substrate is then heated and exposed to light to expose the upper and lower portions of the resist layer. The exposed resist layer is heated and then developed to form the resist pattern, the resist pattern having a lower portion in contact with the substrate, the lower portion having a width which is narrower than the upper portion of the resist pattern, the upper portion of the resist pattern shadowing a portion of the substrate adjacent the lower portion from the direction of a primary etch. In the preferred embodiment, during the exposure a focus setting is used which corresponds to a negative focus shift. Preferably, the upper portion of the resist layer has a first dissolution rate and the lower portion of the resist layer has a second dissolution rate. In the preferred embodiment the resist layer includes a thermally labile material whereby after the heating of the resist layer and substrate, the first dissolution rate is different from the second dissolution rate. It is preferred that during the exposure step, the lower portion of the resist layer receives less light than the upper portion.

The method also includes the step, between the steps of heating the resist layer and substrate, and exposing the resist layer, of depositing a layer of a second resist material over the resist layer, wherein the resist layer has a higher dissolution rate than the second resist layer. The resist layer and second resist layer and substrate are then heated.

The preferred method also comprises the step, prior to the step of applying a layer of a resist on a surface of the substrate, of coating the substrate surface with an underlayer material. It is preferred that the underlayer material is applied by spin-coating, chemical vapor deposition or evaporation. It is also preferred that the underlayer material be capable of exhibiting a chemical interaction with the resist layer. In the preferred embodiment the underlayer material is an anti-reflective material. In the most preferred embodiment the underlayer material is selected from the group consisting of TiN, silicon nitride, silicon oxynitride, TEOS and organic ARC. It is also preferred that the underlayer material comprise a partially soluble material, such as a photoresist resin, which is partially dissolved during the developing of the resist layer. The method also comprises the step, after the step of developing the resist layer, of partially dissolving the underlayer using a solvent.

In another aspect, the present invention comprises a process for manufacturing a semiconductor device using a resist pattern that reduces fluting during an etching process. The process comprises the steps of applying a resist structure on a substrate to be patterned, a lower portion of the resist structure being in contact with the substrate, forming an undercut on the resist structure such that the lower portion of the resist structure has a width that is narrower than an upper portion of the resist structure, the undercut forming a region on the substrate shadowed from a primary etch direction. The process also comprises heating the resist structure and substrate and developing the resist structure to form the resist pattern.

In the preferred embodiment of the process of the present invention, the undercut is formed by the steps of exposing portions of the resist structure to light, wherein during the exposure a focus setting is used which corresponds to a negative focus shift. In the preferred embodiment, the resist structure comprises a first resist layer and a second resist layer, the first resist layer having a higher dissolution rate than the second resist layer. It is preferred that the resist structure comprise an underlayer material over the substrate and a layer of a resist material over the underlayer material, wherein the underlayer material is capable of exhibiting a chemical interaction with the resist layer. In another aspect, the resist structure comprises a partially soluble underlayer material over the substrate and a layer of a resist material over the partially soluble underlayer material.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
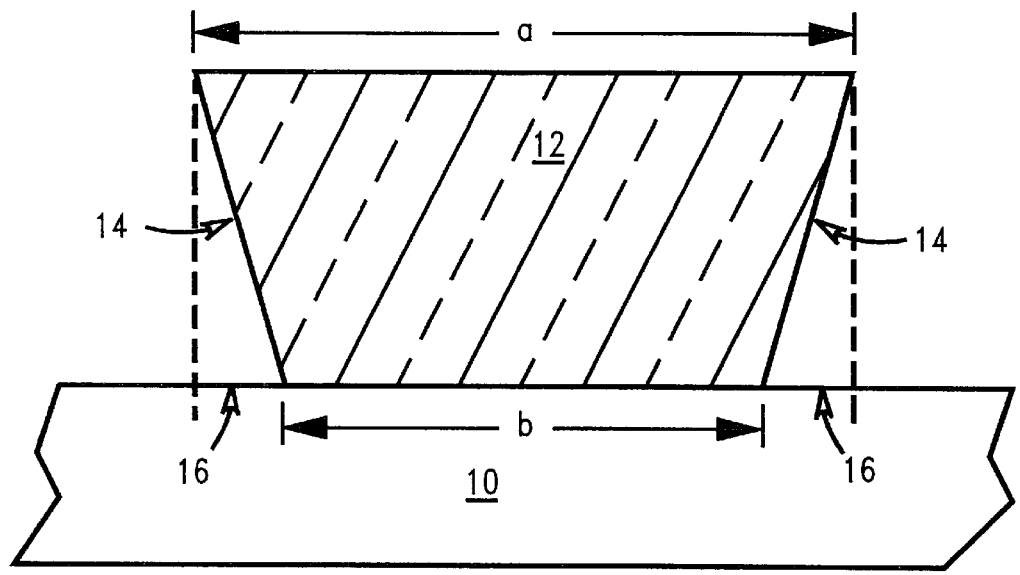
FIG. 1 is a side elevational view of a typical resist structure of the present invention.

In describing the preferred embodiment of the present invention, reference will be made herein to FIGS. 1–4 of the drawings in which like numerals refer to like features of the invention. Features of the invention are not necessarily shown to scale in the drawings.

The present invention is directed to a method and process to reduce plasma etch fluting during the etching of a pattern on a substrate, such as a semiconductor substrate. The invention reduces fluting by forming a resist structure profile that is narrower at its base than the upper portion of the resist structure. The base of the resist structure is in contact with the surface of the substrate. The portion of the substrate that is adjacent to the base of the resist structure is "shadowed" or "shielded" from the primary etch direction by the wider upper portion of the resist structure. The wider portion of the resist structure is also referred to as an "overhang", or alternatively, an "undercut". The wider, upper portion or overhang does not come into direct contact with the substrate. By shielding that portion of the substrate adjacent to the resist structure from the direction of the primary etch, the resist pattern does not transfer to the substrate during etching. It will be appreciated by those skilled in the art that various techniques may be used to form the "overhang" resist structure and represent additional aspects of this invention.

As shown in FIG. 1., resist layer 12 (also referred to as a "photoresist layer") is applied onto substrate 10, where segment "a" is the dimension of the top surface of resist layer 12 and segment "b" is the dimension of the bottom surface of resist layer 12. Segment "b" is in contact with the top surface of substrate 10. In the present invention Segment "b" is narrower than Segment "a". The horizontal dimension of overhang 14 in FIG. 1 is (a–b)/2.

Preferably, resist layer 12 is spin-coated on substrate 10 and has a thickness on the order of 0.5 to 1.0 $\mu$m, but preferably 0.6 to 0.8 $\mu$m. Resist layer 12 and substrate 10 are baked at a temperature ranging from 80° to 150° C. for approximately 30 to 120 seconds depending on the type of material used. For example, products manufactured by Shipley, such as Shipley UV2HS, UV5HS, and JSR M20G, M22G, all have bake temperatures in the range of 130° to 140° C. Shipley APEX has a bake temperature in the range of 80° to 90° C.

Resist layer 12 is then exposed to irradiation through a mask to form an undercut, or overhang 14. The "mask" can be any common transmissive mask that allows certain portions of irradiation to reach the wafer. Typically, the mask is a quartz plate covered by a thin absorbing layer such as chrome or MoSi. The absorbing layer is removed in regions to create a pattern and then light, such as UV light, is projected through the mask. X-ray lithography uses a transmissive mask made of a thin membrane such as silicon nitride or boron nitride, with an absorber such as gold on top. The formation of overhang 14, may be accomplished by use of a negative focus offset (e.g., for 0.25 $\mu$m features, shifting focus 0.05 to 0.30 $\mu$m more negative than would be optimum based strictly on linewidth measurements) to create a resist profile where dimension "b" is up to 0.05 $\mu$m smaller than dimension "a". During exposure, a negative shift focus setting, the distance from the lens surface to the wafer, is used that is more negative than would be determined in a standard irradiation method (i.e., determine the focus setting that gives a maximum or minimum in a plot of linewidth vs. focus setting). A negative focus shift corresponds to moving the best focal plane (and thus the lens) away from the substrate or wafer surface. Considerably less roughness is transferred into the substrate using a negative focus than a positive focus (i.e., best focal plane moved away from wafer surface). The apparatus used to set and/or control the distance from the lens to the wafer surface can vary from one tool type to another. Some examples of methods to measure the distance from lens to wafer are air gauges, capacitance gauges, and reflected light.

After exposure, the exposed resist layer 12 and substrate 10 are baked at a temperature ranging from 80 to 150° C.

(again depending on the type of resist material). Resist layer 12 is then developed in an aqueous base to remove the exposed portions.

Another means of forming the resist pattern structure shown in FIG. 1 is by using a photoresist system or film that has a natural gradient in dissolution characteristics through its thickness, or else creates a gradient in dissolution characteristics during the exposure process. If the chemical composition of the resist film is varied from top to bottom, then the dissolution rate can vary as well. There are several ways to accomplish this. If the resist film includes a thermally labile species, then during the bake process, the dissolution rate for the top portion of the resist film can be changed from that of the bottom portion of the resist film. It is also possible to cause the surface of the resist film to react with oxygen thereby causing a change in the chemical composition of the resist film at its surface and altering the dissolution rate. Using a resist material that absorbs a fraction of the light during exposure such that the bottom portion of the resist film receives less light than the top portion, also results in a difference in dissolution rate from top to bottom of the resist film. In such a system, due to the optical density of the resist layer, less light will reach the bottom of the resist near the substrate surface. With a negative resist, less light absorption will increase the dissolution rate of the resist and result in an overhang or undercut on the resist structure. With a positive resist, the overhang profile can be obtained by altering the dissolution rate from top to bottom of the resist film. For example, surface inhibition will decrease the develop rate of the resist at the surface of the substrate, thus creating an overhang. Alternatively, the dissolution rate of the resist can be altered as a function of distance from the top surface of the substrate by the use of dissolution inhibitors or accelerators in the resist layer that are thermally labile.

The overhang 14 portion of resist layer 12 can be either straight as shown in FIG. 1, or tapered or curved. The principle idea of the invention is to produce a region 16 on substrate 10 that is shadowed from the primary etch direction. By varying focus, the structure of the resist structure profile can be changed from tapered to recursive.

Figure 2:
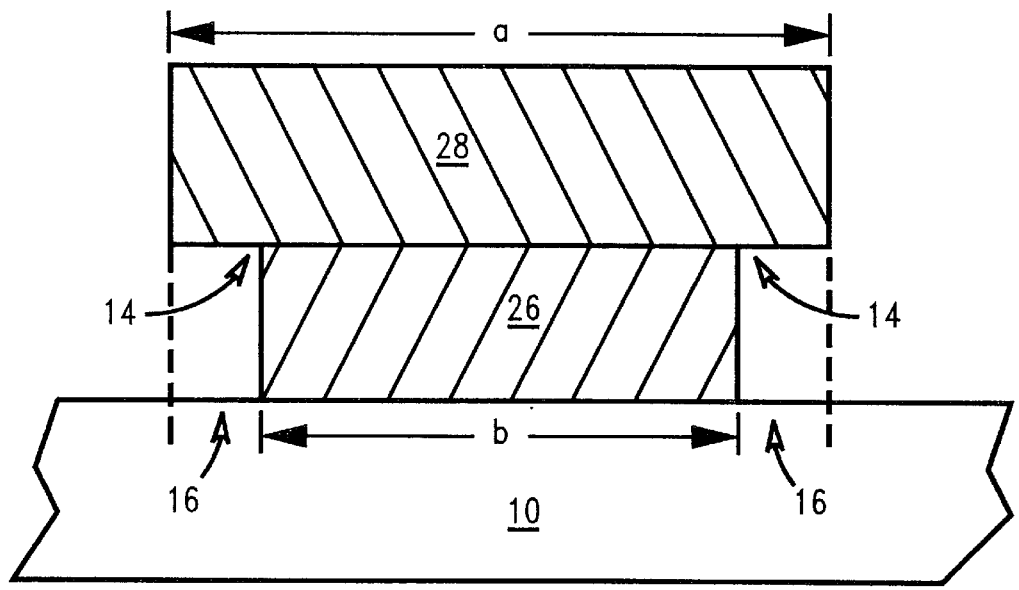
FIG. 2 is a side elevational view of a resist structure of the present invention in which a resist layer is coated over another resist layer.

Another aspect of the present invention uses two photoresist layers to form overhang 14 as shown in FIG. 2. Lower resist layer 26 should preferably have different optical/dissolution characteristics than upper resist layer 28. Lower resist layer 26 is preferably applied by spin coating on substrate 10 and has a thickness on the order of 0.1 to 1.0 $\mu$m, preferably 0.1 to 0.3 $\mu$m. Substrate 10 and lower resist layer 26 are then baked at a temperature ranging from 80° to 150° C. Upper resist layer 28 is applied over lower resist layer 26, preferably by spin-coating, and has a thickness in the range of 0.2 to 1.0 $\mu$m, preferably 0.3 to 0.5 $\mu$m. The structure is then baked at a temperature in the range of 80° to 150° C. for 30 to 120 seconds depending on the materials used. Resist layers 26 and 28 are then developed in an aqueous base to remove the portions of resist layers 26 and 28 that were exposed to light. By selecting a material for lower resist layer 26 that has a higher dissolution rate than the material of upper resist layer 28, overhang 14 is formed. Overhang 14 is formed by either increasing the dissolution parameter of lower resist layer 26 or by etching lower resist layer 26, preferably after developing. The underlayer etch or dissolution rate can easily be modified by altering molecular weight. To enhance the amount of undercut or overhang 14, lower resist layer 26 can be etched further using an aqueous base or another solvent.

Figure 3:
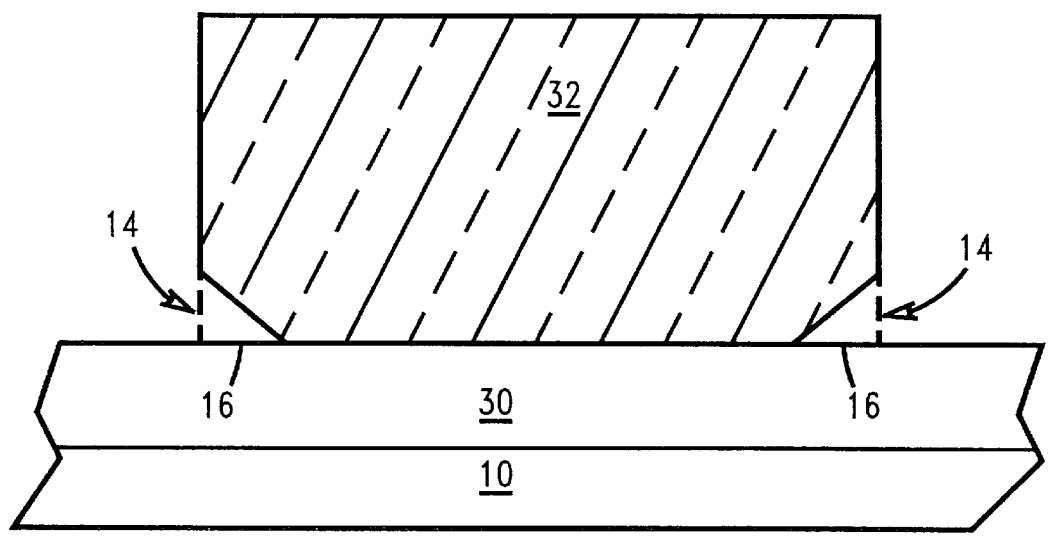
FIG. 3 is a side elevational view of a resist structure of the present invention in which a resist layer is coated over an underlayer.

In another aspect of the present invention, as shown in FIG. 3, a single level resist 32 is used which reacts with underlayer 30 in such a manner as to produce a smaller dimension at the bottom of resist 32 than the upper portion of resist 32. Single layer resist 32 can interact with underlayer 30 under certain conditions to produce undercut profile or overhang 14. Underlayer 30 is applied to substrate 10, preferably by spin coating, chemical vapor deposition or evaporation. Underlayer 30 can be an anti-reflective layer. Possible materials for underlayer 30 include TiN, silicon nitride, silicon oxynitride, TEOS or organic anti-reflective coatings such as the product "SHIPLEY AR3".

The thickness of underlayer 30 typically ranges from 5.0 to 150 $\mu$m, but could be smaller or larger. The thickness varies by material and application. For example, the preferred thickness when using Shipley AR3 is 60 to 150 $\mu$m. For other materials, the preferred range is approximately 10 to 50 $\mu$m if deposited as an extra film. The material could also be integrated in for other uses as well (e.g., as an etch mask or dielectric) and could be much thicker. Using an underlayer 30 which contains acid that can diffuse into the bottom of resist 32 can result in undercut profile 14 when resist 32 is a positive resist material. Likewise, using an underlayer 30 which contains a base that can diffuse into the bottom of resist 32 can result in an undercut profile 14 when resist 32 is a negative resist material.

Resist layer 32, is preferably spin-coated on underlayer 30 and has a thickness in the range of 0.5 to 1.0 $\mu$m. Resist layer 32 should preferably exhibit a chemical interaction with underlayer 30. For instance, a positive resist, such as the product "SHIPLEY UV2HS" will interact with the product "SHIPLEY AR3" to generate undercut profile 14 after developing. A negative resist can also generate an undercut profile on materials such as TiN or silicon oxynitride. The structure, substrate 10, underlayer 30 and resist layer 32, is then baked at a temperature ranging from 80° to 150° C. for 30 to 120 seconds, depending on the materials used. Resist layer 32 is then exposed to irradiation through a mask and the structure is baked at a temperature ranging from 80° to 150° C. for 30 to 120 seconds. Resist layer 32 is then developed in an aqueous base to remove the portions that were exposed to light.

Figure 4:
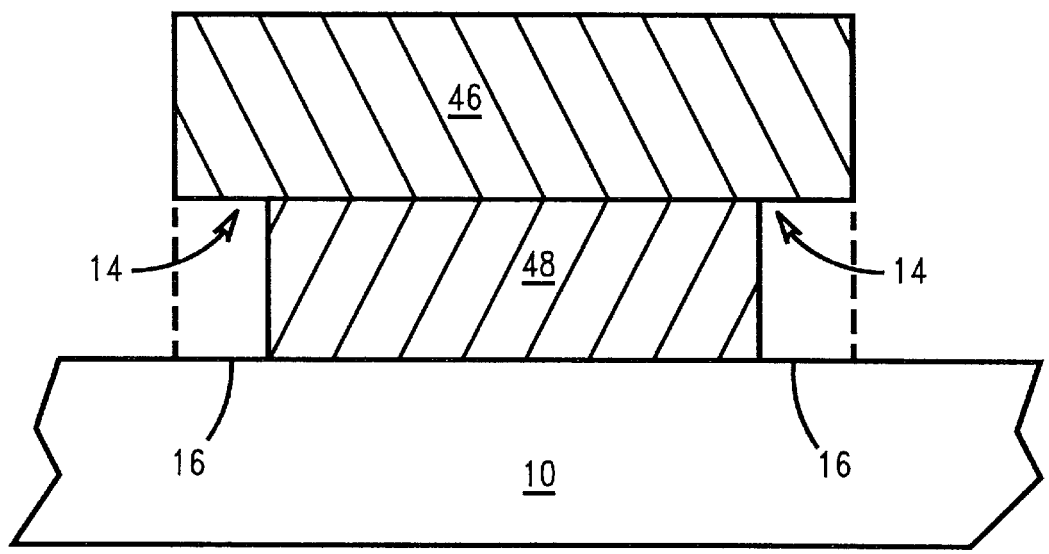
FIG. 4 is a side elevational view of a resist structure of the present invention in which a resist layer is imaged over a partially soluble underlayer.

FIG. 4 illustrates another aspect of the present invention where resist layer 46 is imaged over a partially soluble underlayer 48. Underlayer 48 is applied to substrate 10, preferably by spin-coating, chemical vapor deposition or evaporation. The thickness of underlayer 48 may range from 0.05 to 0.50 $\mu$m. Possible underlayer materials include the resins used in photoresists, such as novolac or p-HOST resin. Resist layer 46 is then preferably spin-coated on underlayer 48. Resist layer 46 may have a thickness in the range of 0.5 to 1.0 $\mu$m. The structure is then baked at a temperature ranging from 80° to 150° C. for 30 to 120 seconds. Resist layer 46 is then exposed to irradiation through a mask and the structure is again baked at a temperature ranging from 80° to 150° C. for 30 to 120 seconds. Resist layer 46 is then developed in an aqueous base to remove the portions that were exposed to light. Underlayer 48 may be partially dissolved as well, producing overhang 14. If underlayer 48 is not dissolved in the aqueous base, it can be partially dissolved using another solvent.

By forming overhang 14 with the methods of the present invention, the pattern of the resist structure is not in direct contact with the surface of substrate 10, and the pattern does not transfer into the surface of substrate 10 during etching. This eliminates the problem of plasma etch fluting during etching. By using an overhang 14 of the present invention, resolution capability of the pattern and line features are not restricted, and the etching process is not limited by etch selectivity.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of forming a resist pattern to reduce fluting on a substrate during an etching process, the method comprising the steps of:

applying a layer of a resist material on a surface of said substrate, said resist layer having an upper portion and a lower portion;

heating said resist layer and substrate;

exposing said resist layer to light using a focus setting which corresponds to a negative focus shift to expose said upper and lower portions of said resist layer;

heating said exposed resist layer and substrate; and developing said exposed resist layer to form said resist pattern, said resist pattern having a lower portion in contact with said substrate, said lower portion having a width which is narrower than said upper portion of said resist pattern, said upper portion of said resist pattern shadowing a portion of said substrate adjacent said lower portion from the direction of a primary etch.

2. A process for manufacturing a semiconductor device using a resist pattern that reduces fluting during an etching process comprising the steps of:

applying a resist structure on a substrate to be patterned, a lower portion of said resist structure being in contact with said substrate;

forming an undercut on said resist structure by exposing the resist structure to light wherein during exposure a focus setting is used which corresponds to a negative focus shift such that said lower portion of said resist structure has a width that is narrower than an upper portion of said resist structure, said undercut forming a region on said substrate shadowed from a primary etch direction;

heating said resist structure and substrate;

developing said resist structure to form said resist pattern.

3. A method of forming a resist pattern to reduce fluting on a substrate during an etching process, the method comprising the steps of:

applying a layer of a resist material on a surface of said substrate, said resist layer having an upper portion having a first dissolution rate and a lower portion having a second dissolution rate, the first and second dissolution rates being different;

heating said resist layer and substrate;

exposing said resist layer to light to expose said upper and lower portions of said resist layer;

heating said exposed resist layer and substrate; and developing said exposed resist layer to form said resist pattern, said resist pattern having a lower portion in contact with said substrate, said lower portion having a width which is narrower than said upper portion of said resist pattern, said upper portion of said resist pattern shadowing a portion said substrate adjacent said lower portion from the direction of a primary etch.

4. The method of claim 3 wherein said resist layer includes a thermally labile material whereby after said heating of said resist layer and substrate said first dissolution rate is different from said second dissolution rate.

5. A process for manufacturing a semiconductor device using a resist pattern that reduces fluting during an etching process comprising the steps of:

applying a resist layer on a substrate to be patterned, said resist layer having an upper portion having a first dissolution rate and a lower portion having a second dissolution rate, the first and second dissolution rates being different and the lower portion of said resist layer being in contact with said substrate;

forming an undercut on said resist layer such that said lower portion of said resist layer has a width that is narrower than an upper portion of said resist layer, said undercut forming a region on said substrate shadowed from a primary etch direction;

heating said resist layer and substrate;

developing said resist layer to form said resist pattern.

6. The process of claim 5 wherein said resist layer includes a thermally labile material whereby after said heating of said resist layer said first dissolution rate is different from said second dissolution rate.

* * * * *